United States Patent
Digman

(10) Patent No.: US 10,760,829 B2
(45) Date of Patent: Sep. 1, 2020

(54) APPLIANCE WITH HIGH CAPACITY CAPACITOR

(71) Applicant: Midea Group Co., Ltd., Beijiao, Shunde, Foshan (CN)

(72) Inventor: Robert M. Digman, Goshen, KY (US)

(73) Assignee: MIDEA GROUP CO., LTD., Bejiao, Shunde, Foshan, Guangdong (CN)

(*) Notice: Subject to any disclaimer, the term of this patent is extended or adjusted under 35 U.S.C. 154(b) by 347 days.

(21) Appl. No.: 15/843,901

(22) Filed: Dec. 15, 2017

(65) Prior Publication Data

US 2019/0186791 A1 Jun. 20, 2019

(51) Int. Cl.
| | |
|---|---|
| F25B 27/00 | (2006.01) |
| H02J 7/34 | (2006.01) |
| F25D 11/00 | (2006.01) |
| H05K 5/00 | (2006.01) |
| H05K 7/20 | (2006.01) |

(52) U.S. Cl.
CPC .............. *F25B 27/00* (2013.01); *F25D 11/00* (2013.01); *H02J 7/345* (2013.01); *H05K 5/0017* (2013.01); *H05K 7/2089* (2013.01)

(58) Field of Classification Search
CPC . F25B 27/00; F25D 11/00; H02J 7/345; H02J 7/342; H02J 7/34; H02J 3/32; H02J 3/28; H05K 5/0017; H05K 7/2089; F24C 7/087; F24C 7/081
See application file for complete search history.

(56) References Cited

U.S. PATENT DOCUMENTS

| | | | |
|---|---|---|---|
| 7,331,426 B2 | 2/2008 | Jahkonen | |
| 7,533,745 B2 | 5/2009 | Laeuffer | |
| 7,750,606 B2 | 7/2010 | Rusan et al. | |
| 7,872,368 B2 | 1/2011 | Karimi et al. | |
| 2013/0271092 A1 | 10/2013 | Borkar | |
| 2018/0034299 A1* | 2/2018 | Seman, Jr. | F25D 11/00 |
| 2018/0142925 A1* | 5/2018 | De Luca | H02J 3/32 |
| 2019/0170427 A1* | 6/2019 | Baum | F25D 23/028 |

FOREIGN PATENT DOCUMENTS

| | | |
|---|---|---|
| CN | 101118406 A | 2/2008 |
| CN | 204530229 U | 8/2015 |
| CN | 104930793 A | 9/2015 |
| CN | 204792471 U | 11/2015 |
| JP | 4901529 B2 | 3/2012 |

(Continued)

OTHER PUBLICATIONS

International Search Report and Written Opinion issued in Application No. PCT/CN2018/074293 dated May 30, 2018.

(Continued)

*Primary Examiner* — Joseph F Trpisovsky
(74) *Attorney, Agent, or Firm* — Middleton Reutlinger

(57) ABSTRACT

A high capacity capacitor is used in an appliance to enable a power circuit of the appliance to power a heating element or other electrical load concurrently with powering one or more additional electrical loads in the appliance using power from both a powerline source and power from the high capacity capacitor such that a combined power consumption in the appliance may be at least temporarily at a level above the power rating of the powerline source.

27 Claims, 6 Drawing Sheets

(56) References Cited

FOREIGN PATENT DOCUMENTS

WO     WO2013038128 A3     6/2013
WO     2016138968     9/2016

OTHER PUBLICATIONS

Kularatna, "Pre-stored supercapacitor energy as a solution for burst energy requirements in domestic in-line fast water heating systems," Industrial Electronics Society, IECON 2014.

Kularatna, "Supercapacitors in a rapid heat transfer application," Chapter 8, Energy Storage Devices for Electronic Systems. Nov. 2014. Retrieved on Jun. 6, 2017.

\* cited by examiner

US 10,760,829 B2

APPLIANCE WITH HIGH CAPACITY CAPACITOR

BACKGROUND

Appliances, and in particular residential major appliances such as refrigerators, dishwashers, ovens, stovetops, ranges, etc., are inherently limited in the amount of power they can instantaneously consume by the power rating of the electrical circuit they are connected to. As an example, a residential dishwasher for use in the United States is generally is limited to a total draw of about 1500 Watts at any given time as it is generally designed for use with a standard residential powerline source such as a 15 Amp, 110-120 Volt residential electrical circuit. As a result, the sizes of the primary electrical loads in a dishwasher, most notably the pump and heating element used to circulate and heat wash fluid, are often limited so as to stay within the power rating of a standard residential powerline source. Doing so, however, can lead to lower performance than might otherwise be desired, as for example a smaller heating element has a lower heating capacity, and thus incorporating such a heating element in a dishwasher can lead to longer cycle times to accommodate the time required to heat the wash fluid to a suitable temperature for washing dishes. Likewise, for refrigerators, compressor sizes may be limited due to the amount of current draw at start up.

Similar issues exist for other appliances, often leading to design compromises being made and/or lower performance being realized to accommodate the power ratings of powerline sources. Therefore, a need continues to exist in the art for an improved manner of optimizing appliance performance within the power constraints of standard residential circuits and other powerline sources.

SUMMARY

The herein-described embodiments address these and other problems associated with the art by utilizing a high capacity capacitor in an appliance to enable a power circuit of the appliance to power a heating element or other electrical load concurrently with powering one or more additional electrical loads in the appliance using power from both a powerline source and power from the high capacity capacitor such that a combined power consumption in the appliance may be at least temporarily at a level above the power rating of the powerline source.

Therefore, consistent with one aspect of the invention, an appliance may include an enclosure, a high capacity capacitor housed by the enclosure, a plurality of electrical loads housed by the enclosure, at least one of the plurality of electrical loads including a heating element, and a power circuit housed by the enclosure and coupling the plurality of electrical loads to a powerline source having a power rating, where the power circuit is configured to power the heating element concurrently with powering one or more additional electrical loads using power from the powerline source and power from the high capacity capacitor such that the plurality of electrical loads are concurrently and collectively powered at a level above the power rating of the powerline source.

In some embodiments, the appliance is a refrigerator and the one or more additional electrical loads includes a compressor. Also, in some embodiments, the appliance includes a stovetop and the heating element includes a stovetop heating element, and the one or more additional electrical loads includes a plurality of additional stovetop heating elements. Further, in some embodiments, the stovetop heating element includes a resistive heating element or an induction heating element. In some embodiments, the appliance includes an oven and the heating element includes a resistive heating element, a microwave heating element or an induction heating element.

In addition, in some embodiments, the appliance is a refrigerator including a hot water dispenser, and the heating element is a hot water dispenser heating element configured to heat water dispensed by the hot water dispenser. In some embodiments, the appliance is a dishwasher, and the heating element is a wash fluid heating element configured to heat a wash fluid circulated within the dishwasher.

In addition, in some embodiments, the power circuit includes a dedicated heating element circuit including the heating element and the high capacity capacitor, and the high capacity capacitor exclusively powers the heating element. Moreover, in some embodiments, the heating element is a supplemental heating element, where the plurality of electrical loads includes a primary heating element, and the power circuit is configured to power the supplemental heating element exclusively using power from the high capacity capacitor while powering the primary heating element exclusively using power from the powerline source. In some embodiments, the power circuit is configured to power at least the heating element using power from the high capacity capacitor concurrently with powering the one or more additional electrical loads using power from the powerline source.

Some embodiments may also include a controller coupled to the power circuit, where the controller is configured to monitor power consumption by the plurality of electrical loads, detect power consumption over a threshold associated with the power rating of the powerline source when monitoring power consumption, and in response to determining the power consumption over the threshold, selectively activate the high capacity capacitor to supply additional power to the power circuit. Moreover, in some embodiments, the controller is configured to monitor power consumption by monitoring an active state of each of the plurality of electrical loads and determining a power consumption based upon the active state of each of the plurality of electrical loads. In some embodiments, the controller is configured to predict a power consumption based upon a request to activate or deactivate one or more of the plurality of electrical loads and to selectively activate the high capacity capacitor prior to activating or deactivating the one or more of the plurality of electrical loads. In addition, in some embodiments, the controller is further configured to cycle between electrical loads among the plurality of electrical loads based upon the monitored power consumption.

Some embodiments may also include a capacitor charging circuit configured to charge the high capacity capacitor. Some embodiments may further include a controller coupled to the capacitor charging circuit and configured to selectively charge the high capacity capacitor during a period of inactivity for the appliance. Also, in some embodiments, the high capacity capacitor is a supercapacitor or an ultracapacitor. Some embodiments may also include a controller, where the controller is configured to selectively activate the high capacity capacitor in response to user selection of a predetermined program or program setting.

Consistent with another aspect of the invention, a method may be provided for operating an appliance of a type including an enclosure, a high capacity capacitor housed by the enclosure, a plurality of electrical loads housed by the enclosure, at least one of the plurality of electrical loads including a heating element, and a power circuit housed by the enclosure and coupling the plurality of electrical loads to a powerline source having a power rating. The method may include powering the plurality of electrical loads with the power circuit only using power from the powerline source and at a level below the power rating of the powerline source, and selectively activating the high capacity capacitor with the power circuit to power the heating element concurrently with powering one or more additional electrical loads using power from the powerline source and power from the high capacity capacitor such that the plurality of electrical loads are concurrently and collectively powered at a level above the power rating of the powerline source.

Consistent with another aspect of the invention, a refrigerator may include an enclosure including a cabinet having one or more food storage compartments and one or more doors closing the one or more food storage compartments, a high capacity capacitor housed by the enclosure, a plurality of electrical loads housed by the enclosure, the plurality of electrical loads including a compressor configured to circulate refrigerant in a refrigeration circuit, and a power circuit housed by the enclosure and coupling at least a portion of the plurality of electrical loads to a powerline source having a power rating, where the power circuit is configured to concurrently power the plurality of electrical loads with power from the powerline source and power from the high capacity capacitor.

In addition, some embodiments may also include a hot water dispenser housed by the enclosure, where the plurality of electrical loads includes a hot water dispenser heating element configured to heat water dispensed by the hot water dispenser, and the power circuit is configured to power the hot water dispenser heating element using power from the high capacity capacitor. Also, in some embodiments, the hot water dispenser and the hot water dispenser heating element are disposed on a first door among the one or more doors. Moreover, in some embodiments, the high capacity capacitor is disposed on the first door. Further, in some embodiments, the plurality of electrical loads includes a supplemental cooling component, and the power circuit is configured to power the supplemental cooling component using power from the high capacity capacitor.

Consistent with another aspect of the invention, a cooking appliance may include an enclosure, a high capacity capacitor housed by the enclosure, a plurality of heating elements housed by the enclosure, and a power circuit housed by the enclosure and coupling the plurality of heating elements to a powerline source having a power rating, where the power circuit is configured to concurrently power multiple heating elements among the plurality of heating elements using power from the powerline source and power from the high capacity capacitor such that the multiple heating elements are concurrently and collectively powered at a level above the power rating of the powerline source.

Also, in some embodiments, the cooking appliance includes a stovetop and the plurality of heating elements includes a plurality of stovetop heating elements. Further, in some embodiments, the appliance includes an oven and the plurality of heating elements includes at least one oven heating element.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

DETAILED DESCRIPTION

Figure 1:
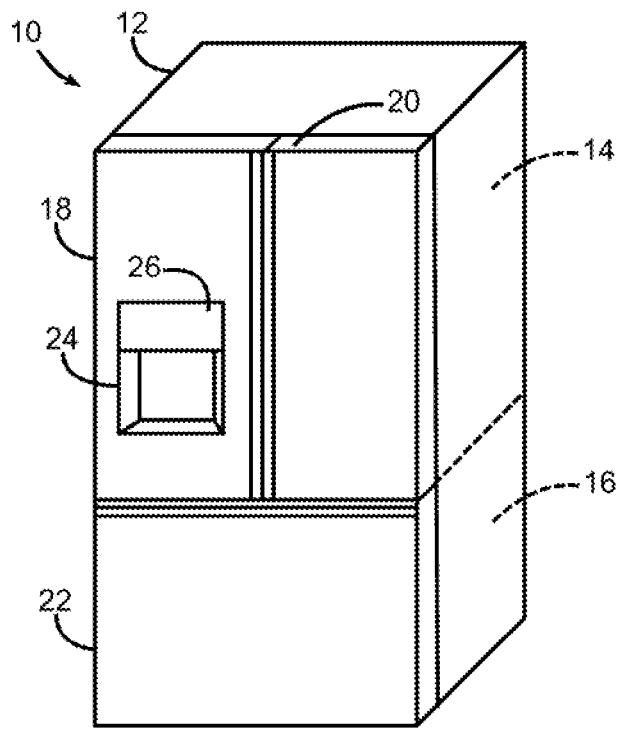
FIG. 1 is a perspective view of a refrigerator consistent with some embodiments of the invention.

Turning now to the drawings, wherein like numbers denote like parts throughout the several views. FIG. 1 illustrates an example refrigerator 10 in which the various technologies and techniques described herein may be implemented. As will become more apparent below, however, the implementation of the herein-described techniques within a refrigerator is not exclusive, and aspects of the invention may be used in connection with other appliances and electrical products in other embodiments.

Refrigerator 10 is a residential-type refrigerator, and as such includes a cabinet or case 12 including one or more food storage compartments (e.g., a fresh food compartment 14 and a freezer compartment 16), as well as one or more fresh food compartment doors 18, 20 and one or more freezer compartment doors 22 disposed adjacent respective openings of food storage compartments 14, 16 and configured to insulate the respective food storage compartments 14, 16 from an exterior environment when the doors are closed.

Fresh food compartment 14 is generally maintained at a temperature above freezing for storing fresh food such as produce, drinks, eggs, condiments, lunchmeat, cheese, etc. Various shelves, drawers, and/or sub-compartments may be provided within fresh food compartment 14 for organizing foods, and it will be appreciated that some refrigerator designs may incorporate multiple fresh food compartments and/or zones that are maintained at different temperatures and/or at different humidity levels to optimize environmental conditions for different types of foods. Freezer compartment 16 is generally maintained at a temperature below freezing for longer-term storage of frozen foods, and may also include various shelves, drawers, and/or sub-compartments for organizing foods therein.

Refrigerator 10 as illustrated in FIG. 1 is a type of bottom mount refrigerator commonly referred to as a French door refrigerator, and includes a pair of side-by-side fresh food compartment doors 18, 20 that are hinged along the left and right sides of the refrigerator to provide a wide opening for accessing the fresh food compartment, as well as a single sliding freezer compartment door 22 that is similar to a drawer and that pulls out to provide access to items in the freezer compartment. It will be appreciated, however, that other door designs may be used in other embodiments, including various combinations and numbers of hinged and/or sliding doors for each of the fresh food and freezer compartments. Moreover, while refrigerator 10 is a bottom mount refrigerator with freezer compartment 16 disposed below fresh food compartment 14, the invention is not so limited, and as such, the principles and techniques may be used in connection with other types of refrigerators in other embodiments. Further, while not required, refrigerator 10 may also include a door-mounted dispenser 24 for dispensing ice and/or water, and in some instances, hot water, coffee, beverages, or other liquids.

Refrigerator 10 also includes a control panel 26, which in the illustrated embodiment is integrated with dispenser 24 on door 18, and which includes various input/output controls such as buttons, indicator lights, alphanumeric displays, dot matrix displays, touch-sensitive displays, etc. for interacting with a user. In other embodiments, control panel 26 may be separate from dispenser 24 (e.g., on a different door), and in other embodiments, multiple control panels may be provided. Further, in some embodiments audio feedback may be provided to a user via one or more speakers, and in some embodiments, user input may be received via a spoken or gesture-based interface. Additional user controls may also be provided elsewhere on refrigerator 10, e.g., within fresh food and/or freezer compartments 14, 16. In addition, refrigerator 10 may be controllable remotely, e.g., via a smartphone, tablet, personal digital assistant or other networked computing device, e.g., using a web interface or a dedicated app.

Figure 2:
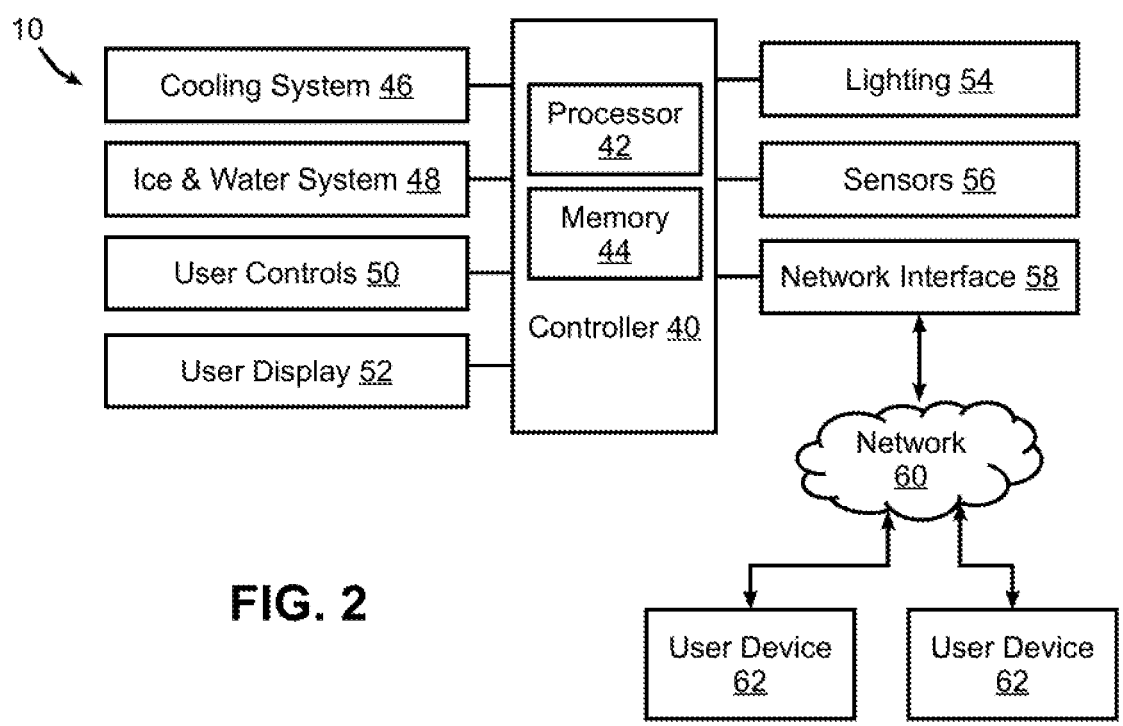
FIG. 2 is a block diagram of an example control system for the refrigerator of FIG. 1.

A refrigerator consistent with the invention also generally includes one or more controllers configured to control a refrigeration system as well as manage interaction with a user. FIG. 2, for example, illustrates an example embodiment of a refrigerator 10 including a controller 40 that receives inputs from a number of components and drives a number of components in response thereto. Controller 40 may, for example, include one or more processors 42 and a memory 44 within which may be stored program code for execution by the one or more processors. The memory may be embedded in controller 40, but may also be considered to include volatile and/or non-volatile memories, cache memories, flash memories, programmable read-only memories, read-only memories, etc., as well as memory storage physically located elsewhere from controller 40, e.g., in a mass storage device or on a remote computer interfaced with controller 40. Controller 40 may also be distributed among multiple controller circuits within refrigerator 12 in some embodiments, so the invention should not be considered to be limited to a controller implemented as a single central controller circuit as is illustrated in FIG. 2.

As shown in FIG. 2, controller 40 may be interfaced with various components, including a cooling or refrigeration system 46, an ice and water system 48, one or more user controls 50 for receiving user input (e.g., various combinations of switches, knobs, buttons, sliders, touchscreens or touch-sensitive displays, microphones or audio input devices, image capture devices, etc.), and one or more user displays 52 (including various indicators, graphical displays, textual displays, speakers, etc.), as well as various additional components suitable for use in a refrigerator, e.g., interior and/or exterior lighting 54, among others.

Controller 40 may also be interfaced with various sensors 56 located to sense environmental conditions inside of and/or external to refrigerator 10, e.g., one or more temperature sensors, humidity sensors, etc. Such sensors may be internal or external to refrigerator 10, and may be coupled wirelessly to controller 40 in some embodiments.

In some embodiments, controller 40 may also be coupled to one or more network interfaces 58, e.g., for interfacing with external devices via wired and/or wireless networks such as Ethernet, Wi-Fi, Bluetooth, NFC, cellular and other suitable networks, collectively represented in FIG. 2 at 60. Network 60 may incorporate in some embodiments a home automation network, and various communication protocols may be supported, including various types of home automation communication protocols. In other embodiments, other wireless protocols, e.g., Wi-Fi or Bluetooth, may be used.

In some embodiments, refrigerator 10 may be interfaced with one or more user devices 62 over network 60, e.g., computers, tablets, smart phones, wearable devices, etc., and through which refrigerator 10 may be controlled and/or refrigerator 10 may provide user feedback.

In some embodiments, controller 40 may operate under the control of an operating system and may execute or otherwise rely upon various computer software applications, components, programs, objects, modules, data structures, etc. In addition, controller 40 may also incorporate hardware logic to implement some or all of the functionality disclosed herein. Further, in some embodiments, the sequences of operations performed by controller 40 to implement the embodiments disclosed herein may be implemented using program code including one or more instructions that are resident at various times in various memory and storage devices, and that, when read and executed by one or more hardware-based processors, perform the operations embodying desired functionality. Moreover, in some embodiments, such program code may be distributed as a program product in a variety of forms, and that the invention applies equally regardless of the particular type of computer readable media used to actually carry out the distribution, including, for example, non-transitory computer readable storage media. In addition, it will be appreciated that the various operations described herein may be combined, split, reordered, reversed, varied, omitted, parallelized and/or supplemented with other techniques known in the art, and therefore, the invention is not limited to the particular sequences of operations described herein.

Numerous variations and modifications to the refrigerator illustrated in FIGS. 1-2 will be apparent to one of ordinary skill in the art, as will become apparent from the description below. Therefore, the invention is not limited to the specific implementations discussed herein.

Figure 3:
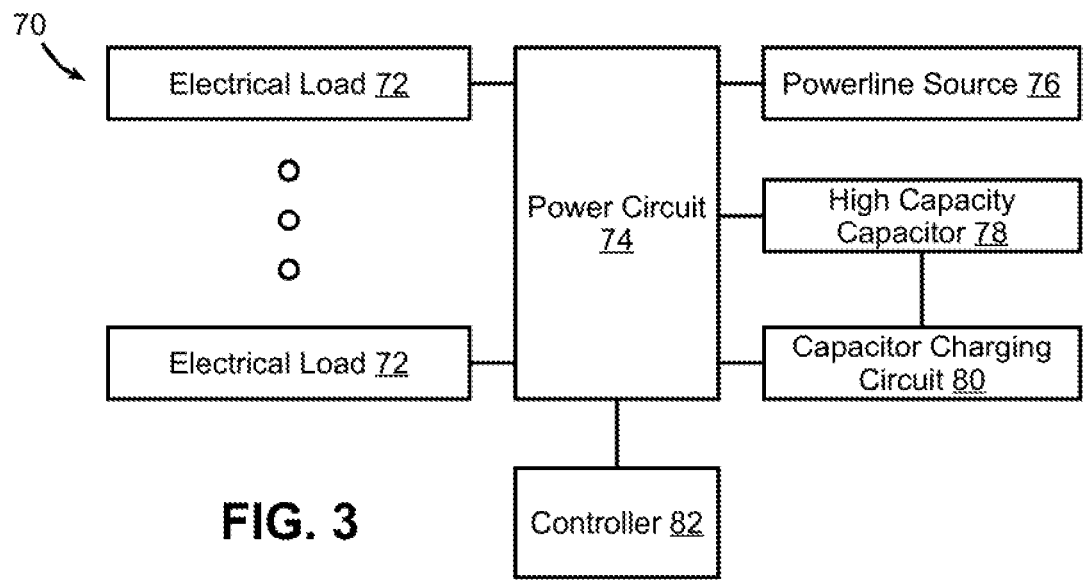
FIG. 3 is a block diagram of an example control system for an appliance consistent with some embodiments of the invention.

Now turning to FIG. 3, embodiments consistent with the invention, as mentioned above, may incorporate one or more high capacity capacitors in an appliance or other electrical product to provide temporarily supplemental power to one or more electrical loads in the appliance while still maintaining the overall power consumption of power from a powerline source by the appliance within the power rating of that powerline source. A powerline source, in this regard, generally refers to a wired, alternating current power source, e.g., a residential or commercial power source, provided in the form of an electrical power circuit having a power rating established therefor representing a permissible current or output power that may be instantaneously drawn from the circuit, and generally protected by a fuse or circuit breaker rated to shut down the electrical circuit when the draw exceeds the power rating of the circuit to protect against shorts and overload conditions that could lead to fires. Both the electrical wires and the switches, plugs, and other components in an electrical circuit are designed for safe operation within the power rating of the electrical circuit, thereby minimizing the risks of electrical fires as long as the draw by electrical loads coupled to the circuit does not exceed the power rating of the circuit.

For residential applications in the United States, for example, typical powerline sources include 15 or 20 Amp 120 Volt circuits, as well as 15, 20 or 30 Amp 240 Volt circuits, which are generally used for electrical products with more substantial power requirements. It will be appreciated that comparable, although somewhat different powerline sources are used in other countries in the world.

As noted above, dishwashers generally are only permitted to draw a total of about 1500 Watts at any given time as they are historically only used with 15 Amp 120 V powerline sources. As such, the heating capacity of the heating element used in a dishwasher is generally limited, thereby increasing cycle times due to the longer amount of time need to heat the wash fluid prior to washing. Likewise, for cooking appliances such as stovetops, ranges, and ovens, many of these cooking appliances are designed for 30 Amp, 240 Volt powerline sources due to the need to support the use of multiple heating elements at the same time, and even in those situations heating elements may be cycled on and off during use to maintain the total draw within the power rating of the powerline source. For refrigerators, many are designed for 15 Amp, 120 V powerlines sources, and as a result, the size of the compressor used to circulate refrigerant and cool the refrigerator may be limited due to the higher startup currents required by larger compressors.

Embodiments consistent with the invention, on the other hand, may introduce a high capacity capacitor, e.g., a supercapacitor or an ultracapacitor, to an appliance to temporarily provide supplemental energy (e.g., in the form of a short burst of energy or a metered amount of energy over time) in the appliance to enable the appliance to consume additional power while maintaining a draw from the powerline source that is still within the power rating of the powerline source. A high capacity capacitor, in this regard, refers to a device that utilizes an electrical field to store energy, and generally has higher discharge rates, has higher storage densities and supports greater numbers of charge/discharge cycles than a battery. As will become more apparent below, high capacity capacitors may be used in a separate, dedicated portion of a power electrical circuit of an appliance to power a particular electrical load, or may be used to concurrently supply power to multiple electrical loads along with power from a powerline source, among other variations.

In some embodiments, for example, an appliance may include an enclosure, a high capacity capacitor housed by the enclosure, multiple electrical loads housed by the enclosure, including at least one heating element, and a power circuit housed by the enclosure and coupling the electrical loads to a powerline source having a power rating. The power circuit may be configured to power at least the heating element concurrently with powering one or more additional electrical loads using power from the powerline source and power from the high capacity capacitor such that the multiple electrical loads are concurrently and collectively powered at a level above the power rating of the powerline source.

In this regard, and with reference to FIG. 3, an appliance 70 may be considered to include various types of major appliances, including refrigerators; cooking appliances such as ovens, stovetops and ranges, among others; dishwashers, laundry appliances such as washers and dryers; air conditioners; etc., although some aspects of the invention may be used in connection with other types of appliances, e.g., countertop or personal appliances, as well as for other electrical products.

An appliance generally includes multiple electrical loads (e.g., electrical loads 72) housed by an enclosure, i.e., enclosed or disposed within or mounted to the enclosure. It will be appreciated that for different types of appliances, different enclosures may be contemplated. For refrigerator 10 of FIG. 1, for example, an enclosure may include case 12 and doors 18, 20 and 22, whereas for other types of appliances, an enclosure may include various housings, support structure, cavities, compartments, doors, etc.

Returning to FIG. 3, the electrical loads 72 in appliance 70 may include various electrically-powered devices that consume electrical power in the appliance, and it will be appreciated that the numbers and/or types of electrical loads may vary based upon the type of appliance. For a refrigerator, for example, the primary electrical loads may include compressors, heating elements (e.g., for a hot water or coffee dispenser), icemaker motors, cooling elements (e.g., thermoelectric cooling elements), solenoids, fans, valves, lighting, controllers (e.g., controller 82), displays, control panels, etc. Likewise, for a dishwasher, the primary electrical loads may include pumps, solenoids, fans, heating elements (e.g., for wash fluid), controllers, displays, control panels, etc. For cooking appliances, the primary electrical loads may include stovetop heating elements (e.g., resistive or inductive heating elements), oven and/or broiler heating elements (e.g., resistive, microwave or induction heating elements), lighting, fans, solenoids, controllers, displays, control panels, etc. For laundry appliances, the primary electrical loads may include pumps, motors, heating elements (e.g., for wash fluid or for drying), fans, solenoids, controllers, displays, control panels, etc. For air conditioners, the primary electrical loads may include compressors, fans, solenoids, cooling elements, controllers, displays, control panels, etc. Other types of appliances may include other types of electrical loads, however, so the invention is not limited to the specific electrical loads enumerated herein.

Moreover, it will be appreciated that some electrical loads will generally have greater power consumption relative to other electrical loads, and in some instances it may be desirable to only manage power consumption by a subset of the electrical loads in an appliance, and allow the other electrical loads to be powered separately and independently from other electrical loads for which power consumption is managed. For example, the power consumption of valves, solenoids, displays and/or controllers may be considered to be negligible in some instances such that power consumption management may effectively ignore these electrical loads or otherwise account for these electrical loads with a static value or factor. Accordingly, power consumption management in an appliance in some embodiments should not be considered to require that all electrical loads in the appliance be managed.

To provide power to electrical loads 72, a power circuit 74 is incorporated into appliance 70, and is coupled to both a powerline source 76 (e.g., a 120 Volt or 240 Volt electrical circuit) that is external to appliance 70 and one or more high capacity capacitors 78 additionally housed by the enclosure of the appliance. As noted above, powerline source 76 may have a power rating, which may in different embodiments may be defined based on wattage or power (e.g., 1500 Watts), or based on current and voltage (e.g., 15, 20 or 30 Amps at 120 or 240 Volts), and power circuit 74 is configured to at least temporarily enable an instantaneous draw by the electrical loads 72 of appliance 70 to exceed the power rating of powerline source 76 through the use of supplemental power provided by high capacity capacitor 78.

Appliance 70 may also include a capacitor charging circuit 80 to charge high capacity capacitor 78, e.g., during idle times where sufficient power headroom exists, or even timed based upon electricity costs. A controller 82 may also be provided to control power circuit 74 and coordinate activities such as cycling between electrical loads, activating/deactivating high capacity capacitor 78, charging high capacity capacitor 78 with capacitor charging circuit 80, monitoring the power consumption or draw by electrical loads 72, etc.

Figure 4:
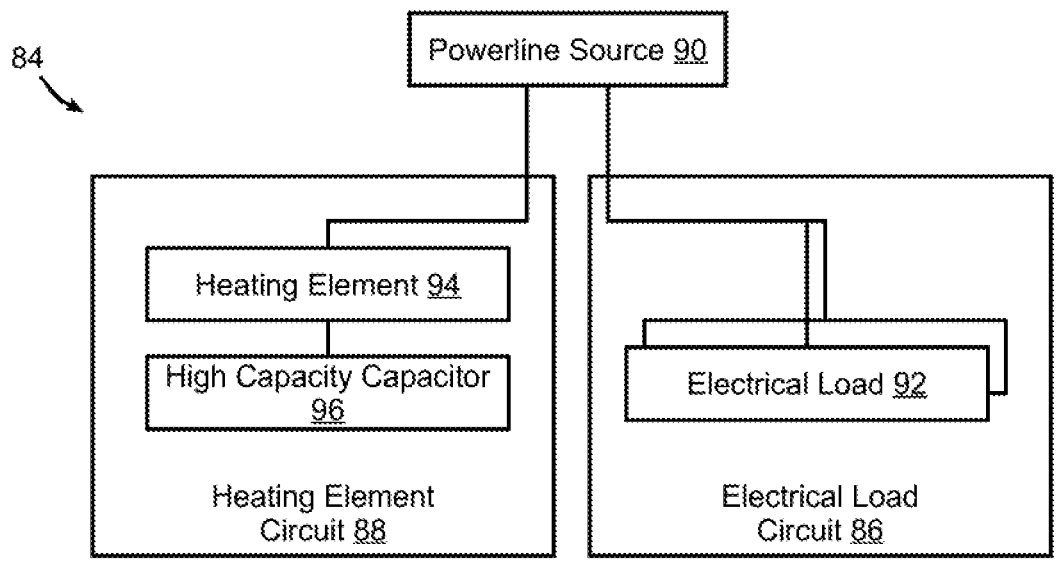
FIG. 4 is a block diagram of an alternate control system to that illustrated in FIG. 3.

It will be appreciated, however, that in some embodiments no controller may be used. Further, in some embodiments, the circuit logic within power circuit 74 may be arranged and configured to provide suitable power to electrical loads 72 through the use of multiple power circuit portions associated with subsets of electrical loads. For example, as illustrated in FIG. 4, a power circuit 84 may include multiple portions, e.g., an electrical load circuit 86 and a heating element circuit 88 that each couple to a powerline source 90. Electrical load circuit 86 may power one or more electrical loads 92 solely using powerline source 90, while heating element circuit 88 may be a dedicated circuit that powers a heating element 94 using a high capacity capacitor 96. In some instances, for example, heating element 94 may be a hot water dispenser heating element in a refrigerator such that high capacity capacitor 96 is used to power heating element 94 to provide nearly instant hot water to a hot water dispenser. Heating element 94 may also be provided with power from powerline source 90 in some embodiments, while in other embodiments powerline source 90 may be used to charge high capacity capacitor 96, such that heating element 94 is powered solely by high capacity capacitor 96. Further, in some embodiments, heating element 94 may be a secondary heating element that is used to supplement a primary heating element in electrical load circuit 86 such that additional heating capacity may be utilized when needed.

In other embodiments, however, a power circuit consistent with the invention may actively manage power consumption by multiple electrical loads, including one or more heating elements, to power the heating elements(s) concurrently with additional electrical loads using power from the powerline source and power from the high capacity capacitor such that heating element(s) and the additional electrical loads are concurrently and collectively powered at a level above the power rating of the powerline source.

Figure 5:
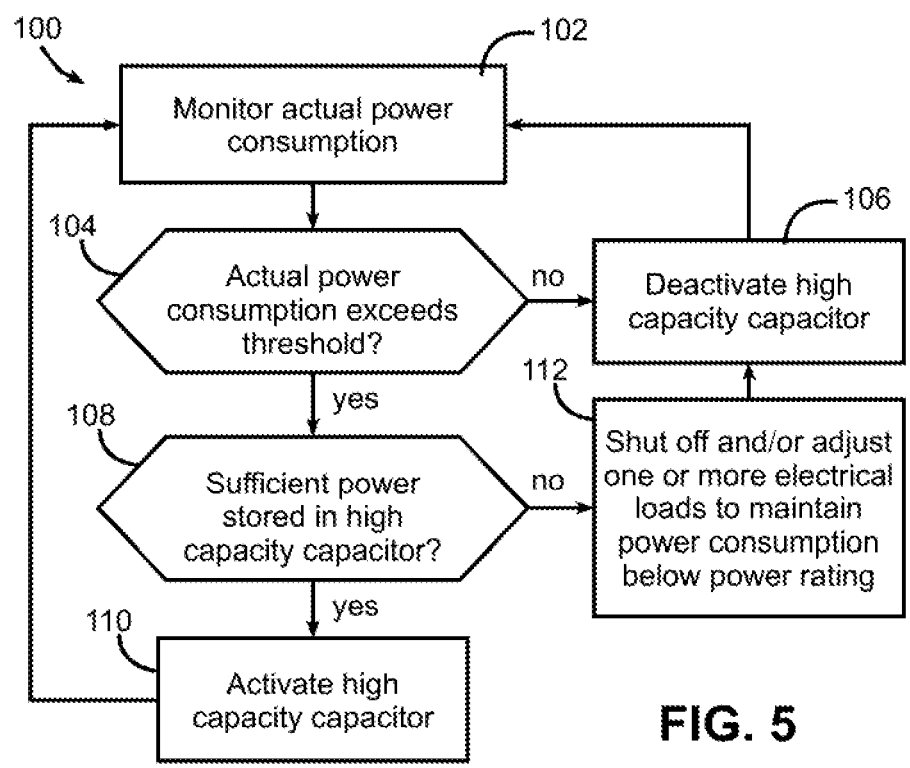
FIG. 5 is a flowchart illustrating an example sequence of operations for controlling power in the control system of FIG. 3.

FIG. 5, for example, illustrates an example sequence of operations 100 for managing power consumption by multiple electrical loads based upon actual power consumption of the multiple electrical loads, e.g., as may be implemented by a controller such as controller 82 of appliance 70 of FIG. 2. In block 102, actual power consumption by the electrical loads may be monitored. In some embodiments, for example, the collective power consumption in the appliance may be monitored, e.g., using a current sensor coupled to the input from the powerline source. In some embodiments, the draw of individual electrical loads may be monitored and summed to obtain the actual power consumption of the appliance. In still other embodiments, the activation states of individual electrical loads may be monitored and the power consumption of each electrical load may be calculated based upon a known draw of each electrical load when activated. In some embodiments, for example, each electrical load may be associated with a static power consumption (e.g., 100 Watts) that the electrical load draws when activated, or a variable power consumption based on a varying state of the electrical load (e.g., based on a formula that relates power consumption to a variable power setting such as 50 Watts for a heating element that is set at 50% of maximum power, 74 Watts for a heating element that is set at 70% of maximum power, etc.).

Next, block 104 determines whether the actual power consumption exceeds a threshold associated with the power rating of the powerline source. For example, the threshold may be equal to the power rating in some instances, while in other instances, the threshold may vary from the power rating, e.g., to trigger activation of the high capacity capacitor when power consumption is within 5% of the power rating of the powerline source.

If not, control passes to block 106 to maintain the high capacity capacitor in an inactive state, and control returns to block 102 to continue to monitor actual power consumption in the appliance. If, however, the actual power consumption exceeds the threshold, block 104 passes control to block 108 to determine if sufficient power is stored in the high capacity capacitor, i.e., if the high capacity capacitor is charged over a predetermined amount. If so, block 108 passes control to block 110 to activate the high capacity capacitor, e.g., by controlling a relay or switch to couple the high capacity capacitor to specific electrical loads, or to a shared power line to the power circuit that powers some or all of the electrical loads. Control then returns to block 102 to continue monitoring the actual power consumption.

Returning to block 108, if sufficient power is not stored in the high capacity capacitor (e.g., after the high capacity capacitor has discharged for some period of time after being activated), control instead passes to block 110 to manage the power consumption between the plurality of electrical loads, e.g., by shutting electrical loads on or off, varying the power supplied or consumed by one or more electrical loads, cycling between electrical loads, etc., such that the overall power consumption of the appliance is maintained below the power rating of the powerline source. Control then passes to block 106 to deactivate the high capacity capacitor and then to block 102 to continue monitoring the power consumption of the appliance.

Figure 6:
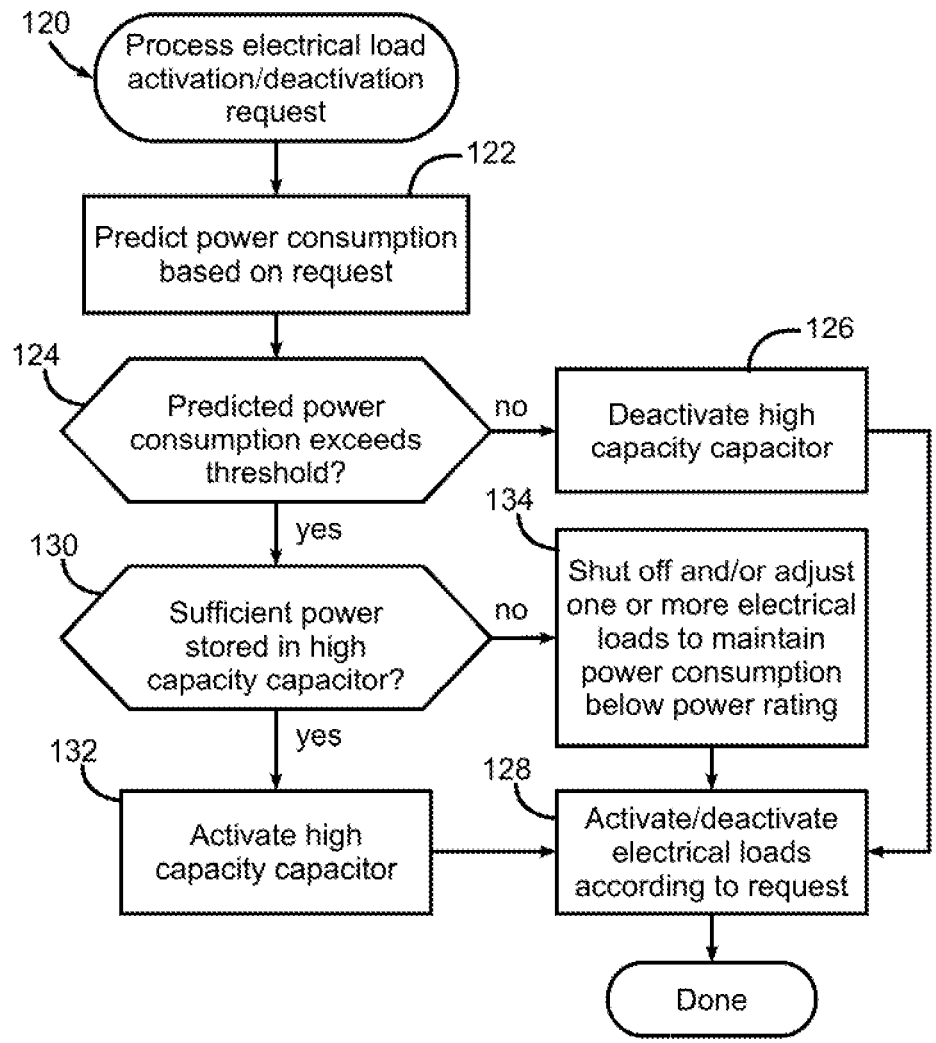
FIG. 6 is a flowchart illustrating another example sequence of operations for controlling power in the control system of FIG. 3.

In other embodiments, and as illustrated by sequence of operations 120 of FIG. 6, power consumption by multiple electrical loads in an appliance may be managed by a controller such as controller 82 of appliance 70 of FIG. 2 based upon predicted power consumption of the multiple electrical loads. Sequence of operations 120, for example, may be performed whenever a request is issued in an appliance that will result in a state change that activates, deactivates, or otherwise varies the consumption of one or more electrical loads in the appliance. A request, in this regard, may be considered to include requests or commands issued to a controller, as well as lower level requests as simple as a control line switching between logic states (e.g., as a result of a user pressing a button or flipping a switch on a control panel).

First, in block 122 power consumption by the electrical loads in the appliance may be predicted based upon the activation state of each electrical load once the request has been processed. For example, if the request is a request to start a wash or cooking cycle, to turn on a stovetop burner, to preheat an oven, to initiate a new operation or phase in a wash or cooking cycle, or any other instance where the state of an electrical load will be altered, the resulting power consumption in the appliance may be predicted. As above in connection with sequence of operations 100, the predicted power consumption may be based in some embodiments on static or variable values associated with each electrical load that are summed for those electrical loads that will be active upon completion of the request.

Control then passes to block 124 to determine whether the predicted power consumption exceeds a threshold associated with the power rating of the powerline source. For example, the threshold may be equal to the power rating in some instances, while in other instances, the threshold may vary from the power rating, e.g., to trigger activation of the high capacity capacitor when the predicted power consumption is within 5% of the power rating of the powerline source.

If not, control passes to block 126 to maintain the high capacity capacitor in an inactive state. Control then passes to block 128 to activate and/or deactivate one or more electrical loads and thereby handle the request. Sequence of operations 120 is then complete.

Returning to block 124, if the predicted power consumption exceeds the threshold, control passes to block 130 to determine if sufficient power is stored in the high capacity capacitor, i.e., if the high capacity capacitor is charged over a predetermined amount. If so, block 130 passes control to block 132 to activate the high capacity capacitor, e.g., by controlling a relay or switch to couple the high capacity capacitor to specific electrical loads, or to a shared power line to the power circuit that powers some or all of the electrical loads. Control then passes to block 128 to activate and/or deactivate one or more electrical loads and thereby handle the request, whereby sequence of operations 120 is then complete.

Returning to block 130, if sufficient power is not stored in the high capacity capacitor (e.g., after the high capacity capacitor has discharged for some period of time after being activated), control instead passes to block 134 to manage the power consumption between the plurality of electrical loads, e.g., by shutting electrical loads on or off, varying the power supplied or consumed by one or more electrical loads, cycling between electrical loads, etc., such that the overall power consumption of the appliance is maintained below the power rating of the powerline source. Control then passes to block 128 to activate and/or deactivate one or more electrical loads and thereby handle the request, whereby sequence of operations 120 is then complete.

In still other embodiments, a high capacity capacitor may be activated or deactivated in connection with activation or deactivation of a particular electrical load, e.g., a heating element. Thus, for example, if a hot water dispenser in a refrigerator is turned on, if a wash cycle has been started in a dishwasher or laundry appliance or if a cooking cycle has been started, a high capacity capacitor may be automatically activated and used to temporarily supply supplemental power to a heating element to increase the heating capacity of the appliance and thereby shorten the amount of time that would otherwise be required to heat a water, wash fluid, burner, oven cavity, etc. In addition, in some instances, multiple heating elements may be used, with a primary heating element powered by a powerline source and with a high capacity capacitor used to supply power to a secondary heating element when additional heating capacity is desired.

Thus, in various embodiments, a task that relies on a particular type of electrical load may be at least temporarily powered by a high capacity capacitor in a number of different configurations. For example, some embodiments may perform a task using a single electrical load that is configured to be powered by a powerline source, by a high capacity capacitor or by a combination of both. In other embodiments, however, a task may be performed by an electrical load that is configured to be powered exclusively by a high capacity capacitor, whereby the powerline source is only used to charge the high capacity capacitor in addition to powering additional electrical loads for other tasks. In still other embodiments, a task may be selectively performed with multiple electrical loads that are separately and/or exclusively powered by a powerline source and a high capacity capacitor such that the combined actions of the multiple electrical loads perform the desired task. As used herein, it should be understood that an electrical load that is exclusively powered by a particular power source (e.g., a high capacity capacitor or a powerline source) is not powered by another power source.

Furthermore, in some embodiments the activation of a high capacity capacitor may be in response to a predetermined program or program setting in an appliance. For example, in a dishwasher or laundry washing machine, a "speed wash" cycle may be provided as a user-selectable type of wash cycle that, when executed, activates a high capacity capacitor during the cycle to speed the heating of water or wash fluid, while other wash cycles may execute with the high capacity capacitor deactivated. As another example, a "boost" or accelerate option may be provided for various programs when increased power is desired, e.g., to increase water temperatures and/or reduce cycle times.

Figure 7:
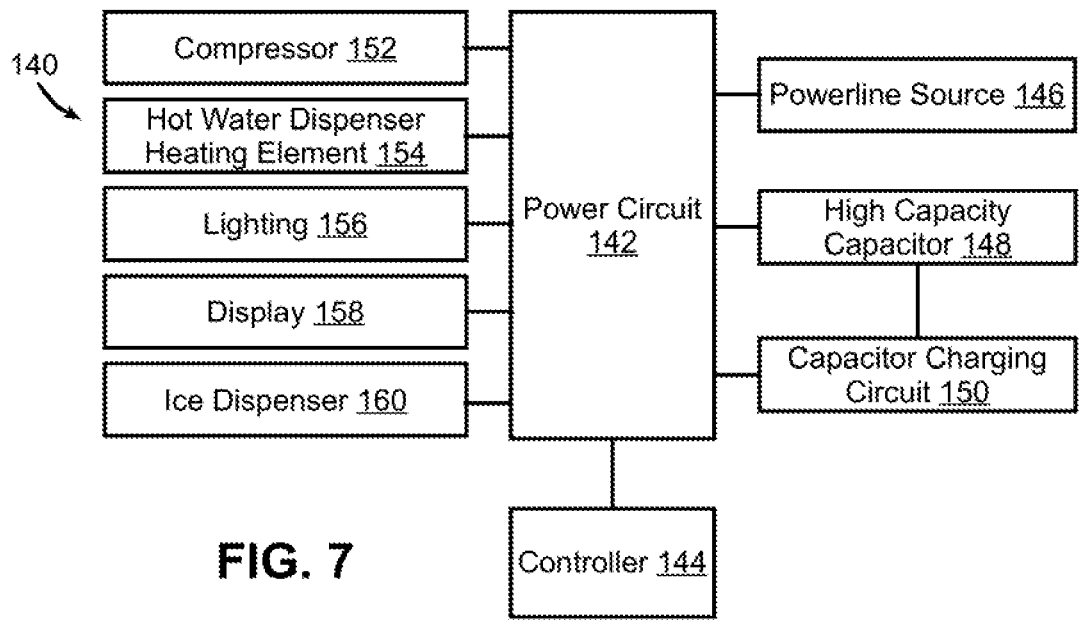
FIG. 7 is a block diagram of an example control system for a refrigerator consistent with some embodiments of the invention.

As noted above, the herein-described techniques may be used in connection with various types of appliances. FIG. 7, for example, illustrates an example refrigerator 140 having a power circuit 142 controlled by a controller 144 and coupled to a powerline source 146 as well as a high capacity capacitor 148 charged by a charging circuit 150. Refrigerator 140 in this embodiment includes various electrical loads, including a compressor 152, a hot water dispenser heating element 154, lighting 156, a display 158 and an ice dispenser 160 (which may include, for example, an auger motor, a water valve, a control panel, etc.).

It may be desirable, for example, to provide power above and beyond a power rating for powerline source 146 to power hot water dispenser heating element 154 and thereby rapidly heat water, e.g., to heat water to a temperature of 190 degrees within a few seconds whenever a user desires to dispense hot water. Doing so, for example, may enable a hot water dispenser to be used without having to maintain a hot water storage container at an elevated temperature to support on-demand dispensing of hot water.

In some embodiments, a hot water dispenser may be provided on a door of refrigerator 140 (e.g., in the position shown in FIG. 1), and in some embodiments, hot water dispenser heating element 154 may also be disposed in the door such that a single water line may be supplied through the door to support both hot and cold water dispensing. In addition, in some embodiments an icemaker may be disposed in the door, and the water supply may also provide water to the icemaker. In some embodiments, for example, a self-contained ice and water system may be disposed in the door, and may even include a compressor and refrigeration circuit in the door. In other embodiments, however, the hot water dispenser heating element may be disposed in the case of the refrigerator, and hot water may be supplied to the hot water dispenser through a dedicated water line to the door.

In addition, in some of the aforementioned embodiments, the high capacity capacitor may also be disposed in the door along with the hot water dispenser and the hot water dispenser heating element. In other embodiments, however, the high capacity capacitor may be disposed in the refrigerator case. Irrespective of where the high capacity capacitor is disposed, however, it will be appreciated that water may be heated for the hot water dispenser by powering the hot water dispenser heating element with the high capacity capacitor, and that the heating element generally can at least temporarily be powered concurrently with powering the compressor of the refrigerator, even if the combined power consumption exceeds the power rating of the powerline source.

Further, in some embodiments, in addition to or in lieu of powering a hot water dispenser heating element, a high capacity capacitor may be used to supply other supplemental power in a refrigerator. For example, a high capacity capacitor may be used to power a supplemental cooling component, e.g., thermoelectric cooling element, secondary compressor, or other type of cooling component, e.g., to provide primary or supplemental cooling for an icemaking system or to provide a "fast freeze" feature, e.g., in a compartment or region of a refrigerator. Similarly, a high capacity capacitor may be used to supply a heating element to provide a thawing feature in a compartment or region of a refrigerator.

Figure 8:
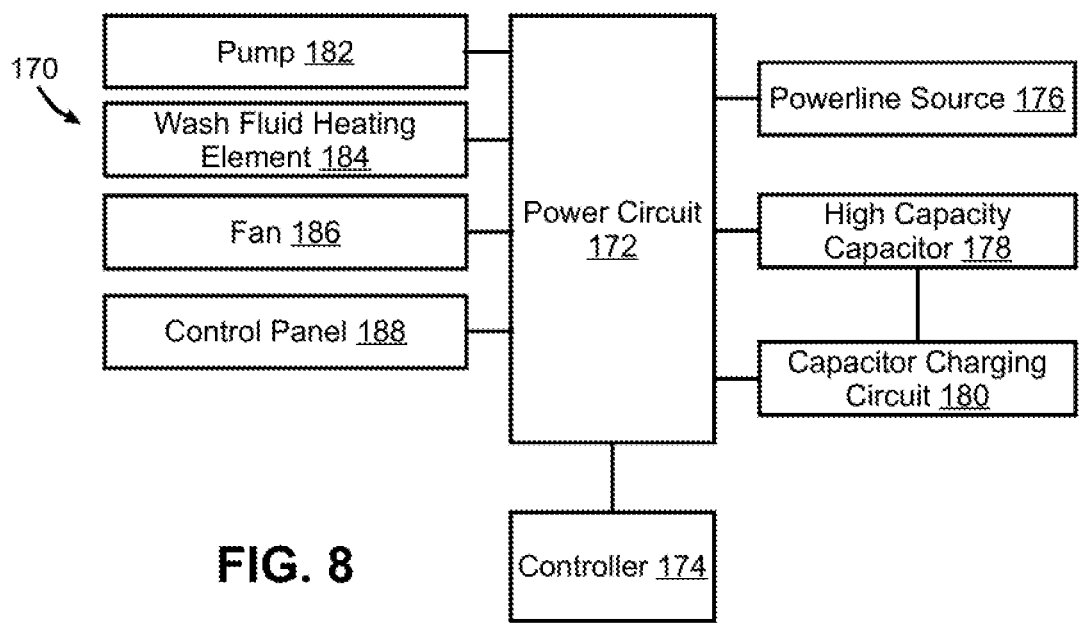
FIG. 8 is a block diagram of an example control system for a dishwasher consistent with some embodiments of the invention.

As another example, FIG. 8 illustrates an example dishwasher 170 having a power circuit 172 controlled by a controller 174 and coupled to a powerline source 176 as well as a high capacity capacitor 178 charged by a charging circuit 180. Dishwasher 170 in this embodiment includes various electrical loads, including a pump 182, a wash fluid heating element 184, a fan 186 and a control panel 188. It may be desirable, for example, to provide power above and beyond a power rating for powerline source 176 to power wash fluid heating element 184 and thereby rapidly heat the wash fluid at the start and/or at other points in a wash cycle, thereby shortening the overall duration of the wash cycle.

Figure 9:
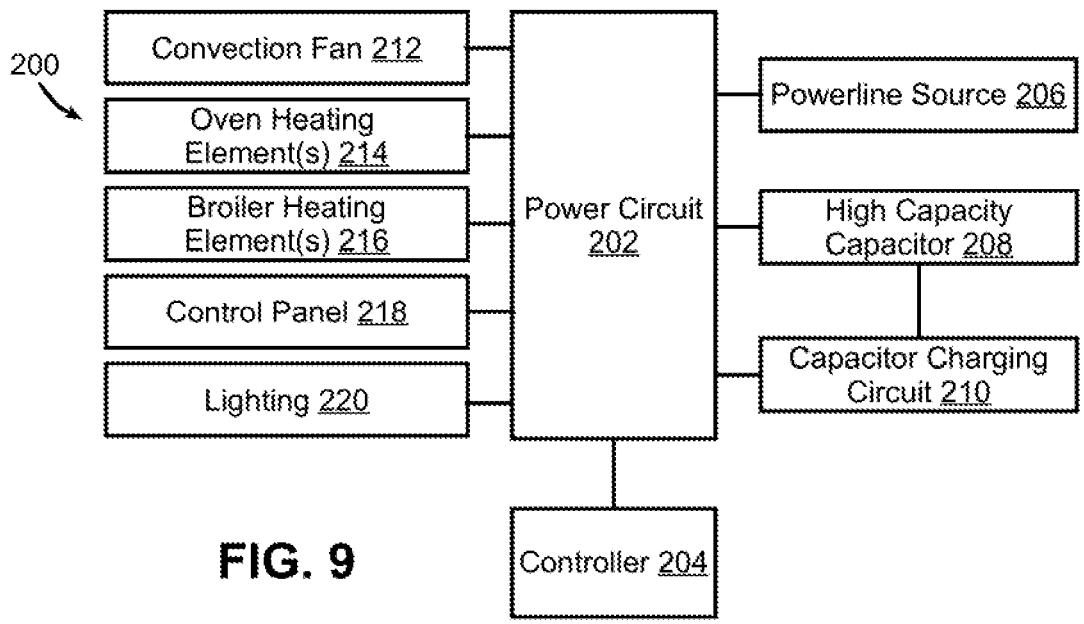
FIG. 9 is a block diagram of an example control system for an oven cooking appliance consistent with some embodiments of the invention.

As a further example, FIG. 9 illustrates an example oven 200 having a power circuit 202 controlled by a controller 204 and coupled to a powerline source 206 as well as a high capacity capacitor 208 charged by a charging circuit 210. Oven 200 in this embodiment includes various electrical loads, including a convection fan 212, one or more oven heating elements 214, one or more broiler heating elements 216, a control panel 218 and lighting 220. Further, depending upon whether the oven is a double oven, a microwave oven, a single oven, etc., the number and types of heating elements may vary. It may be desirable, for example, to provide power above and beyond a power rating for powerline source 206 to rapidly preheat the oven, or otherwise to avoid having to cycle heating elements on and off during a cooking cycle as might otherwise be required in order to maintain overall power consumption within the power rating of the powerline source.

Figure 10:
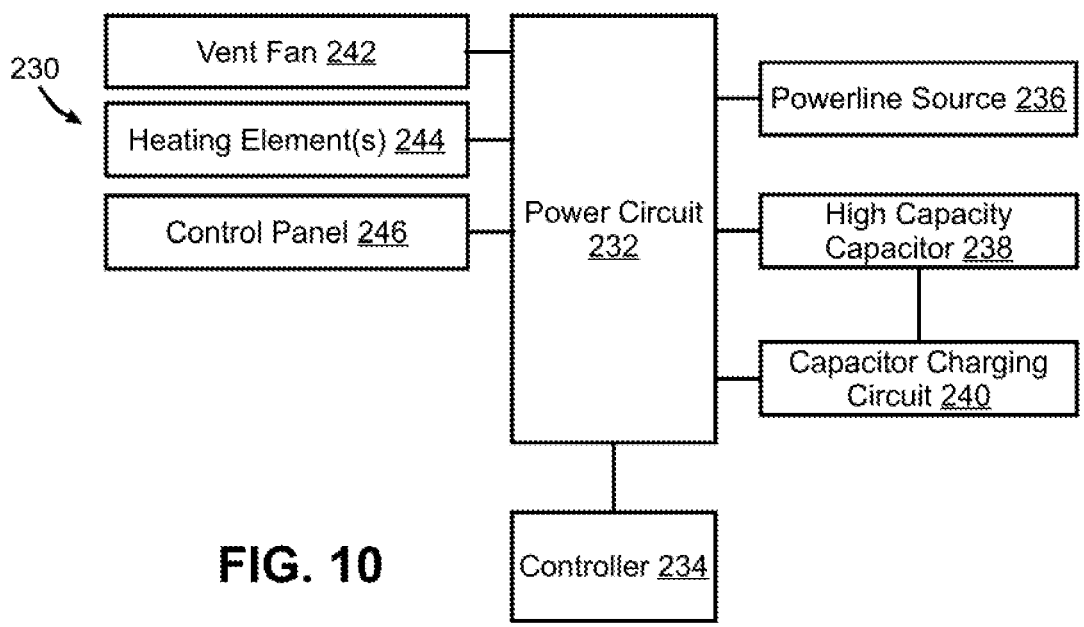
FIG. 10 is a block diagram of an example control system for a stovetop cooking appliance consistent with some embodiments of the invention.

As yet another example, FIG. 10 illustrates an example stovetop 230 having a power circuit 232 controlled by a controller 234 and coupled to a powerline source 236 as well as a high capacity capacitor 238 charged by a charging circuit 240. Stovetop 230 in this embodiment includes various electrical loads, including a vent fan 242, one or more heating elements 244 (e.g., one or more burners), and a control panel 246. Further, depending upon the size and style of stovetop, the number and types of heating elements may vary (e.g., resistive or inductive heating elements). It may be desirable, for example, to provide power above and beyond a power rating for powerline source 236 to rapidly preheat a burner, or otherwise to avoid having to cycle heating elements on and off as might otherwise be required in order to maintain overall power consumption within the power rating of the powerline source.

It will also be appreciated that for a range-type appliance that includes both a stovetop and one or more ovens, a combination of the electrical loads discussed above in connection with FIGS. 9 and 10 may be coupled to a common power circuit, powerline source, and high capacity capacitor. Likewise, for a laundry appliance such as a washer or dryer, similar techniques may be used to shorten preheat times and manage power demands with reduced reliance on cycling or lowering power supplied to electrical loads.

It will be appreciated that the implementation of a power circuit, a capacitor charging circuit, and a controller to manage power consumption in an appliance will vary greatly between different types of appliances; however, such implementation would be well within the abilities of those of ordinary skill having the benefit of the instant disclosure.

Thus, in various embodiments, a high capacity capacitor may be used to provide supplemental power to an appliance to provide overall power consumption in the appliance above and beyond a power rating of the powerline source to which the appliance is connected. In some instances, for example, a high capacity capacitor may be placed in the same circuit, as an existing heating or cooling element and used to boost the output of the single element. In other instances, a high capacity capacitor could be used to power a secondary heating/cooling element to boost overall output, with the advantage in some instances of potentially better efficiency of each individual element, since each element may be optimized to the loads it will receive. In still other instances, a high capacity capacitor can be used to power independent heating/cooling systems for special features such as instant hot water from a refrigerator, and in still other instances, a high capacity capacitor can be used to manage loads in an appliance, for instance in a cooking product, thereby reducing the need to cycle between multiple electrical loads (e.g., in a cooking appliance, multiple cooktop burners and/or oven heating elements) at peak demand times.

It will be appreciated that various additional modifications may be made to the embodiments discussed herein, and that a number of the concepts disclosed herein may be used in combination with one another or may be used separately. Other modifications will be apparent to those of ordinary skill in the art having the benefit of the instant disclosure. Therefore, the invention lies in the claims hereinafter appended.

What is claimed is:

1. An appliance, comprising:
    an enclosure;
    a high capacity capacitor housed by the enclosure;
    a plurality of electrical loads housed by the enclosure, at least one of the plurality of electrical loads including a heating element;
    a power circuit housed by the enclosure and coupling the plurality of electrical loads to a powerline source having a power rating, wherein the power circuit is configured to power the heating element concurrently with powering one or more additional electrical loads using power from the powerline source and power from the high capacity capacitor such that the plurality of electrical loads are concurrently and collectively powered at a level above the power rating of the powerline source; and a controller coupled to the power circuit, the controller configured to:

monitor power consumption by the plurality of electrical loads;

detect power consumption over a threshold associated with the power rating of the powerline source when monitoring power consumption; and in response to determining the power consumption over the threshold, selectively activate the high capacity capacitor to supply additional power to the power circuit.

2. The appliance of claim 1, wherein the appliance is a refrigerator and the one or more additional electrical loads includes a compressor.

3. The appliance of claim 1, wherein the appliance includes a stovetop and the heating element includes a stovetop heating element, and wherein the one or more additional electrical loads includes a plurality of additional stovetop heating elements.

4. The appliance of claim 1, wherein the heating element comprises a resistive heating element or an induction heating element.

5. The appliance of claim 1, wherein the appliance includes an oven and the heating element comprises a resistive heating element, a microwave heating element or an induction heating element.

6. The appliance of claim 1, wherein the appliance is a refrigerator including a hot water dispenser, and wherein the heating element is a hot water dispenser heating element configured to heat water dispensed by the hot water dispenser.

7. The appliance of claim 1, wherein the appliance is a dishwasher, and wherein the heating element is a wash fluid heating element configured to heat a wash fluid circulated within the dishwasher.

8. The appliance of claim 1, wherein the power circuit includes a dedicated heating element circuit including the heating element and the high capacity capacitor, and wherein the high capacity capacitor exclusively powers the heating element.

9. The appliance of claim 1, wherein the heating element is a supplemental heating element, wherein the plurality of electrical loads includes a primary heating element, and wherein the power circuit is configured to power the supplemental heating element exclusively using power from the high capacity capacitor while powering the primary heating element exclusively using power from the powerline source.

10. The appliance of claim 1, wherein the power circuit is configured to power at least the heating element using power from the high capacity capacitor concurrently with powering the one or more additional electrical loads using power from the powerline source.

11. The appliance of claim 1, wherein the controller is configured to selectively activate the high capacity capacitor to reduce an activation time for at least one of the plurality of electrical loads.

12. The appliance of claim 1, wherein the controller is configured to monitor power consumption by monitoring an active state of each of the plurality of electrical loads and determining a power consumption based upon the active state of each of the plurality of electrical loads.

13. The appliance of claim 12, wherein the controller is configured to predict a power consumption based upon a request to activate or deactivate one or more of the plurality of electrical loads and to selectively activate the high capacity capacitor prior to activating or deactivating the one or more of the plurality of electrical loads.

14. The appliance of claim 1, wherein the controller is further configured to cycle between electrical loads among the plurality of electrical loads based upon the monitored power consumption.

15. The appliance of claim 1, further comprising a capacitor charging circuit configured to charge the high capacity capacitor.

16. The appliance of claim 15, wherein the controller is coupled to the capacitor charging circuit and configured to selectively charge the high capacity capacitor during a period of inactivity for the appliance.

17. The appliance of claim 1, wherein the high capacity capacitor is a supercapacitor or an ultracapacitor.

18. The appliance of claim 1, wherein the controller is configured to selectively activate the high capacity capacitor in response to user selection of a predetermined program or program setting.

19. A method of operating an appliance including an enclosure, a high capacity capacitor housed by the enclosure, a plurality of electrical loads housed by the enclosure, at least one of the plurality of electrical loads including a heating element, and a power circuit housed by the enclosure and coupling the plurality of electrical loads to a powerline source having a power rating, the method comprising:

powering the plurality of electrical loads with the power circuit only using power from the powerline source and at a level below the power rating of the powerline source;

with a controller coupled to the power circuit, monitoring power consumption by the plurality of electrical loads;

with the controller, detecting power consumption over a threshold associated with the power rating of the powerline source when monitoring power consumption; and with the controller, and in response to determining the power consumption over the threshold, selectively activating the high capacity capacitor with the power circuit to supply additional power to the power circuit and to power the heating element concurrently with powering one or more additional electrical loads using power from the powerline source and power from the high capacity capacitor such that the plurality of electrical loads are concurrently and collectively powered at a level above the power rating of the powerline source.

20. A refrigerator, comprising:

an enclosure including a cabinet having one or more food storage compartments and one or more doors closing the one or more food storage compartments;

a high capacity capacitor housed by the enclosure;

a plurality of electrical loads housed by the enclosure, the plurality of electrical loads including a compressor configured to circulate refrigerant in a refrigeration circuit;

a power circuit housed by the enclosure and coupling at least a portion of the plurality of electrical loads to a powerline source having a power rating, wherein the power circuit is configured to concurrently power the plurality of electrical loads with power from the powerline source and power from the high capacity capacitor; and a controller coupled to the power circuit, the controller configured to:
 monitor power consumption by the plurality of electrical loads;
 detect power consumption over a threshold associated with the power rating of the powerline source when monitoring power consumption; and
 in response to determining the power consumption over the threshold, selectively activate the high capacity capacitor to supply additional power to the power circuit.

21. The refrigerator of claim 20, further comprising a hot water dispenser housed by the enclosure, wherein the plurality of electrical loads includes a hot water dispenser heating element configured to heat water dispensed by the hot water dispenser, wherein the power circuit is configured to power the hot water dispenser heating element using power from the high capacity capacitor.

22. The refrigerator of claim 21, wherein the hot water dispenser and the hot water dispenser heating element are disposed on a first door among the one or more doors.

23. The refrigerator of claim 22, wherein the high capacity capacitor is disposed on the first door.

24. The refrigerator of claim 20, wherein the plurality of electrical loads includes a supplemental cooling component, and wherein the power circuit is configured to power the supplemental cooling component using power from the high capacity capacitor.

25. A cooking appliance, comprising:
an enclosure;
a high capacity capacitor housed by the enclosure;
a plurality of heating elements housed by the enclosure;
a power circuit housed by the enclosure and coupling the plurality of heating elements to a powerline source having a power rating, wherein the power circuit is configured to concurrently power multiple heating elements among the plurality of heating elements using power from the powerline source and power from the high capacity capacitor such that the multiple heating elements are concurrently and collectively powered at a level above the power rating of the powerline source; and
a controller coupled to the power circuit, the controller configured to:
 monitor power consumption by the plurality of heating elements;
 detect power consumption over a threshold associated with the power rating of the powerline source when monitoring power consumption; and
 in response to determining the power consumption over the threshold, selectively activate the high capacity capacitor to supply additional power to the power circuit.

26. The cooking appliance of claim 25, wherein the cooking appliance includes a stovetop and the plurality of heating elements includes a plurality of stovetop heating elements.

27. The cooking appliance of claim 25, wherein the appliance includes an oven and the plurality of heating elements includes at least one oven heating element.

* * * * *